United States Patent
Shibatani (12)

(10) Patent No.: US 6,661,154 B2
(45) Date of Patent: Dec. 9, 2003

(54) DRIVING APPARATUS AND METHOD USING ELECTROMECHANICAL CONVERSION ELEMENTS

(75) Inventor: Kazuhiro Shibatani, Sakai (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/964,846

(22) Filed: Sep. 28, 2001

(65) Prior Publication Data

US 2002/0057040 A1 May 16, 2002

(30) Foreign Application Priority Data

Sep. 29, 2000 (JP) ........................................ 2000-298429

(51) Int. Cl.[7] .............................................. H01L 41/08
(52) U.S. Cl. ............................ 310/316.01; 310/316.02; 310/323.02; 310/328
(58) Field of Search ....................... 310/316.01, 316.02, 310/323.01, 323.02, 328

(56) References Cited

U.S. PATENT DOCUMENTS

| 4,613,782 | A | * | 9/1986 | Mori et al. | ............ 310/323.02 |
| 5,563,465 | A | * | 10/1996 | Nakahara et al. | ............ 318/328 |
| 5,821,667 | A | * | 10/1998 | Takagi et al. | ........... 310/316.01 |
| 6,448,694 | B2 | * | 9/2002 | Matsuo et al. | ............... 310/328 |

FOREIGN PATENT DOCUMENTS

| JP | 58-148682 | 9/1983 |
| JP | 10-210775 | 8/1998 |
| JP | 10-225151 | 8/1998 |

* cited by examiner

*Primary Examiner*—Mark Budd
(74) *Attorney, Agent, or Firm*—McDermott, Will & Emery

(57) ABSTRACT

In a truss-type driving apparatus, the amplitude of each displacement member and the phase difference therebetween are detected, and by adjusting the amplitudes or the phases of the impressed voltages to drive the displacement members based on the results of such detection, the elliptical locus drawn by the synthesizing member of the truss-type driving apparatus during driving is adjusted such that the desired driving characteristics are obtained.

17 Claims, 11 Drawing Sheets

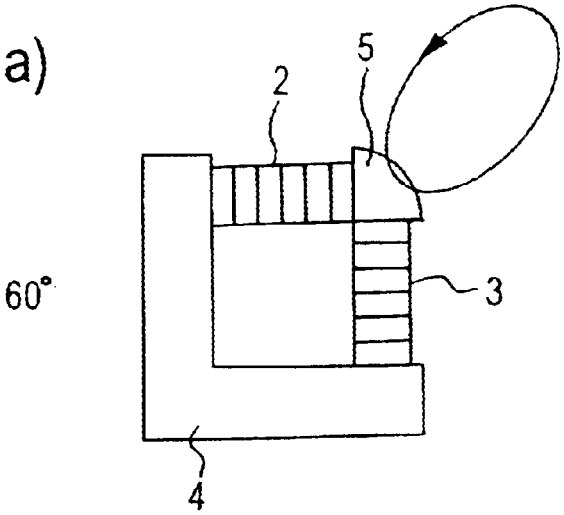
FIG. 3(a)  60°
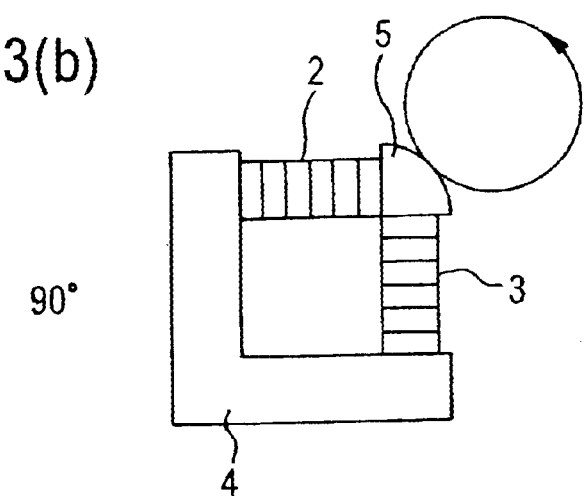
FIG. 3(b)  90°
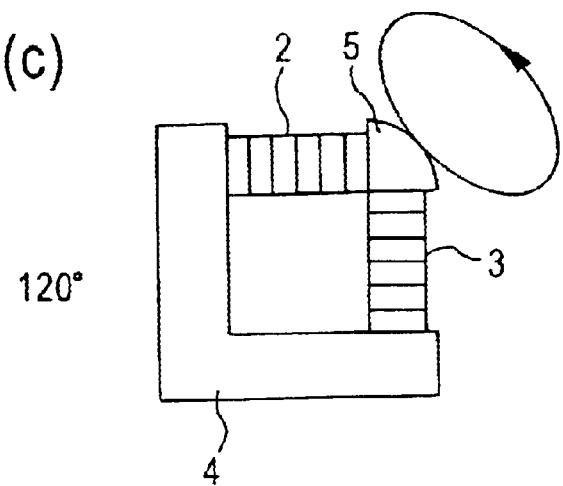
FIG. 3(c)  120°

60°
amplitude of A < amplitude of B

60°
amplitude of A > amplitude of B

120°
amplitude of A < amplitude of B

120°
amplitude of A > amplitude of B

DRIVING APPARATUS AND METHOD USING ELECTROMECHANICAL CONVERSION ELEMENTS

This application is based on application No. JP2000-298429 filed in Japan, the contents of which is hereby incorporated by reference.

BACKGROUND OF THE INVENTION

1. Field of the Invention

The present invention relates to an improved driving apparatus and method that drives a driven member, such as a disk-like rotor that rotates or a slider that moves in a linear fashion. Specifically, it relates to an improved driving apparatus and method using electromechanical conversion elements, and more particularly to a truss-type improved driving apparatus and method using electromechanical conversion elements.

2. Description of the Related Art

Actuators are known in the conventional art that have a construction in which a drive unit comprising displacement members consisting piezoelectric elements, etc. is placed in pressure contact with a driven member using a pressure unit, wherein the bases of the displacement members are fixed to a fixing unit, and a synthesizing member is attached to the other ends thereof such that the displacement members cross each other.

A method to drive such an actuator such that the synthesizing member draws an elliptical locus has been proposed (Japanese Laid-Open Patent Application Sho 58-148682).

However, in this proposed method, because information regarding the locus of the synthesizing member is not detected for the adjustment of the locus, it is difficult to maintain the locus of the synthesizing member in such a way that the desired driving characteristics are obtained.

OBJECTS AND SUMMARY

The present invention was created in view of this situation, and an object thereof is to provide an improved driving apparatus and method. Specifically, an object of the present invention is to provide an improved truss-type driving apparatus and method using electromechanical conversion elements, and more particularly, to provide a truss-type actuator that can detect information regarding the elliptical locus of the synthesizing member for the adjustment of the locus in order to ensure the desired driving characteristics, as well as to provide a driving method for such an actuator.

In order to attain this and other objects, according to one aspect of the present invention, the driving apparatus has (i) a base, (ii) multiple displacement members, the base ends of which are fixed to the base and the tip ends of which are combined at one location, said displacement members generating a prescribed displacement, (iii) a pressure unit that keeps the synthesizing member, at which the tip ends of the displacement members are combined, in pressure contact with the driven member, which comprises the object of driving, (iv) a driving circuit that impresses drive signals to the displacement members, (v) a controller that controls the driving circuit so that the synthesizing member moves in an elliptical path and the drive force is transmitted to the driven member, and (vi) a first detector that detects the amplitudes of the displacement members and the phase difference therebetween, wherein based on the results of detection by the detectors, the amplitudes or phases of the voltages impressed to the displacement members are changed to adjust the elliptical locus of the synthesizing member. In addition, the controller changes the phases of the impressed voltages to adjust the flatness of the elliptical locus. Furthermore, the controller changes the amplitudes and phases of the impressed voltages to adjust the direction of the elliptical locus. Moreover, the controller changes the amplitudes and phases of the impressed voltages to adjust the drive force transmitted to the driven member.

In this driving apparatus, the desired driving characteristics are obtained through detection of the amplitude and phase of each displacement member pertaining to the elliptical locus of the synthesizing member and adjustment of this locus based on the results of detection.

According to another aspect of the present invention, the driving apparatus further has a memory means that stores the target amplitudes and target phase differences that correspond to the target elliptical locus of the synthesizing member, and the controller changes at least either the amplitudes or phases of the impressed voltages so that the difference between the amplitudes detected by the first detector and the target amplitudes stored in the memory means and the difference between the phase difference detected by the first detector and the target phase difference stored in the memory means are eliminated. The memory means stores multiple target amplitudes and phase differences that correspond to the target elliptical locus of the synthesizing member in such a manner that they are associated with a timing at which the parameters of the elliptical movement should be changed, and the elliptical movement when the driven member begins to move is different from such movement at other times. Specifically, the elliptical movement is changed such that the driving characteristics include low speed and high torque when the driven member begins to move, while including high speed and low torque otherwise. Furthermore, according to another aspect, the controller drives only one of the multiple displacement members.

According to this aspect, because the controller changes either the amplitudes or phases of the impressed voltage such that the difference between the amplitudes detected by the first detector and the target amplitudes stored in the memory means and the difference between the phase difference detected by the first detector and the target phase difference stored in the memory means are eliminated, the elliptical locus of the synthesizing member is automatically adjusted and the desired driving characteristics are obtained. Furthermore, according to this aspect, if the target amplitudes and phase differences for the target elliptical locus, for the beginning of which low speed and high torque is used, whereas high speed and low torque is used otherwise, are stored in the memory means in such a way that they are associated with the timing at which the elliptical movement of the synthesizing member should be changed, smooth driving from the start of the elliptical movement through regular driving can be enabled.

According to another aspect of the present invention, the driving apparatus further has a second phase difference detecting means that detects the phase difference between the voltage impressed to each displacement member and the electric current drawn thereto, and the controller changes the drive frequency of each displacement member based on the phase difference detected by the second phase difference detecting means. After adjusting the driving frequencies to become the resonance frequencies based on the phase difference detected by the second phase difference detecting means, the controller changes either the amplitudes or phase of the impressed voltage such that the difference between the amplitudes and phase difference detected by the first detector and the target amplitudes and phase difference stored in the memory means, respectively, are eliminated. The multiple displacement members comprise multi-layer piezoelectric elements, and the first detecting means detects the amplitude and phase of the voltage impressed to each displacement member based on the electric current that is drawn to the multi-layer piezoelectric element.

According to this aspect, it is possible to reduce the phase difference between the voltage impressed to each displacement member and the current drawn thereto to zero or near zero by having the controller change the oscillation frequency of the oscillator based on the phase difference detected by the second phase difference detecting means, and consequently, each displacement member may be driven using an efficient resonance frequency. In addition, because the amplitudes and phase difference may be detected by the multi-layer piezoelectric elements themselves, which are incorporated in the driving apparatus as an actuator, the need for separate distortion sensors, etc. may be eliminated.

BRIEF DESCRIPTION OF THE DRAWINGS

These and other objects and features of the present invention will become apparent from the following description of preferred embodiments thereof taken in conjunction with the accompanying drawings, in which.

Figure 4:
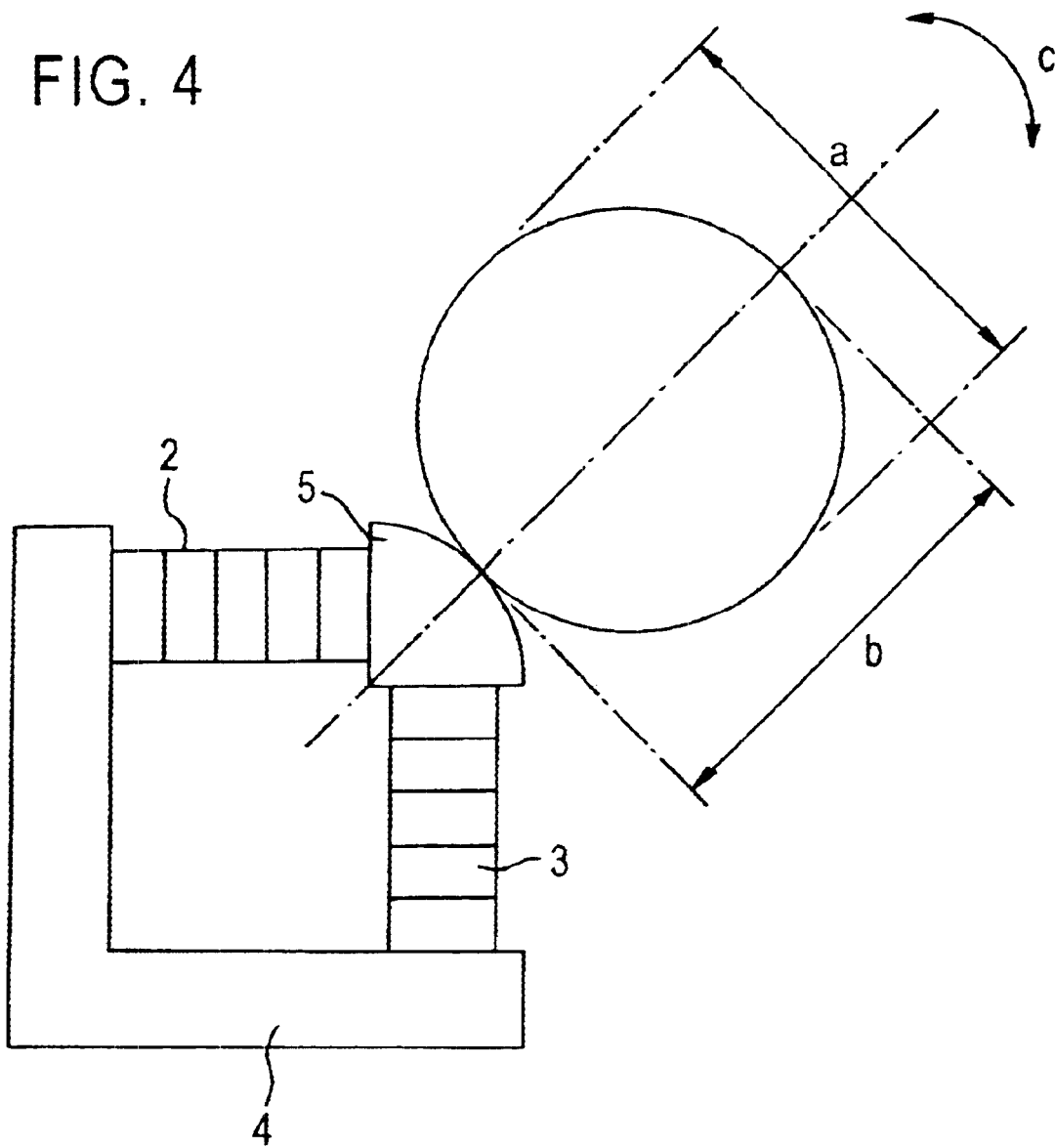
Figure 5A:
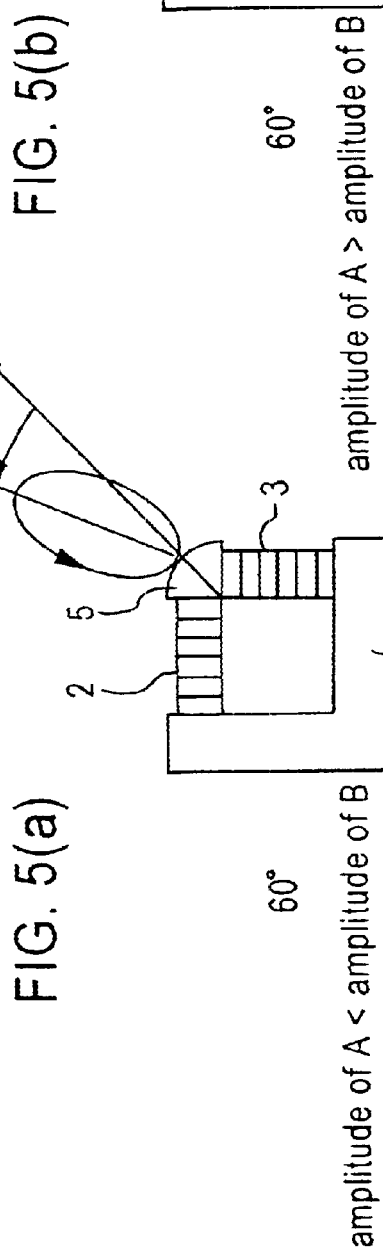
Figure 5B:
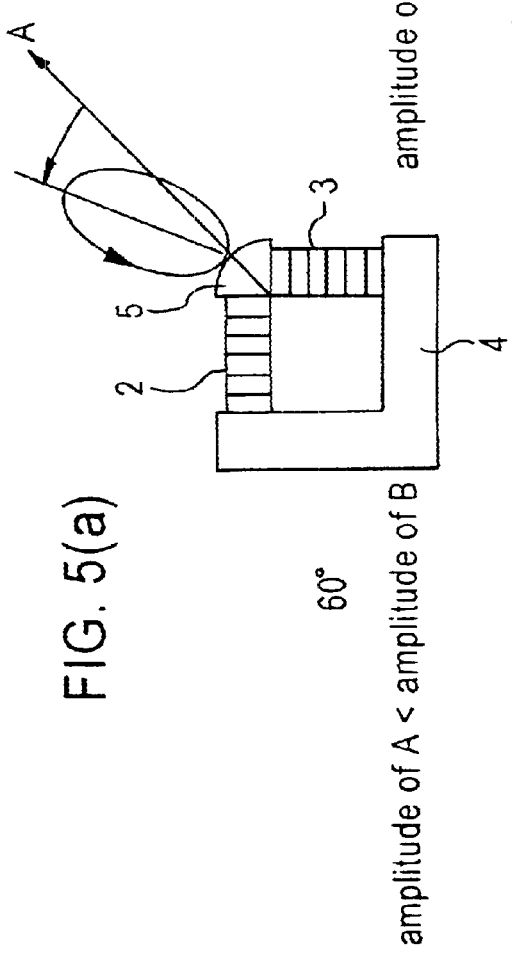
Figure 5C:
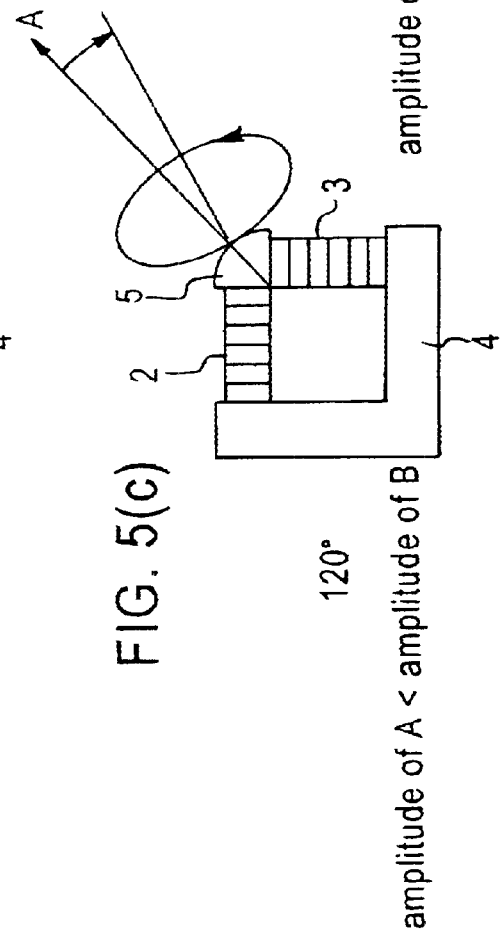
Figure 5D:
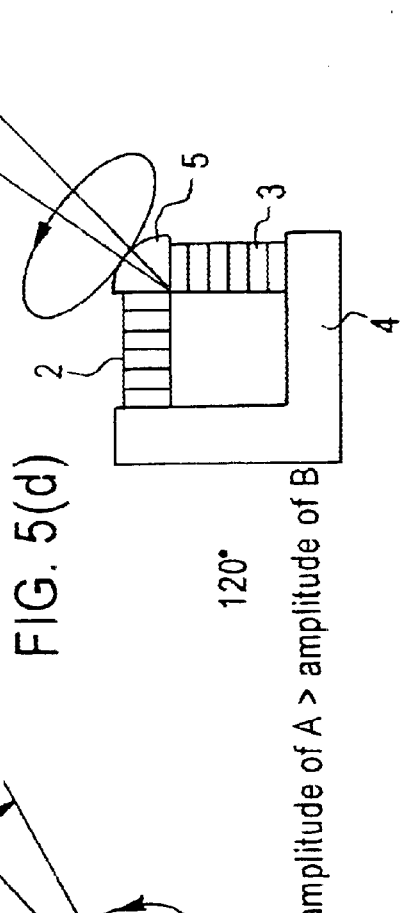
Figure 6:
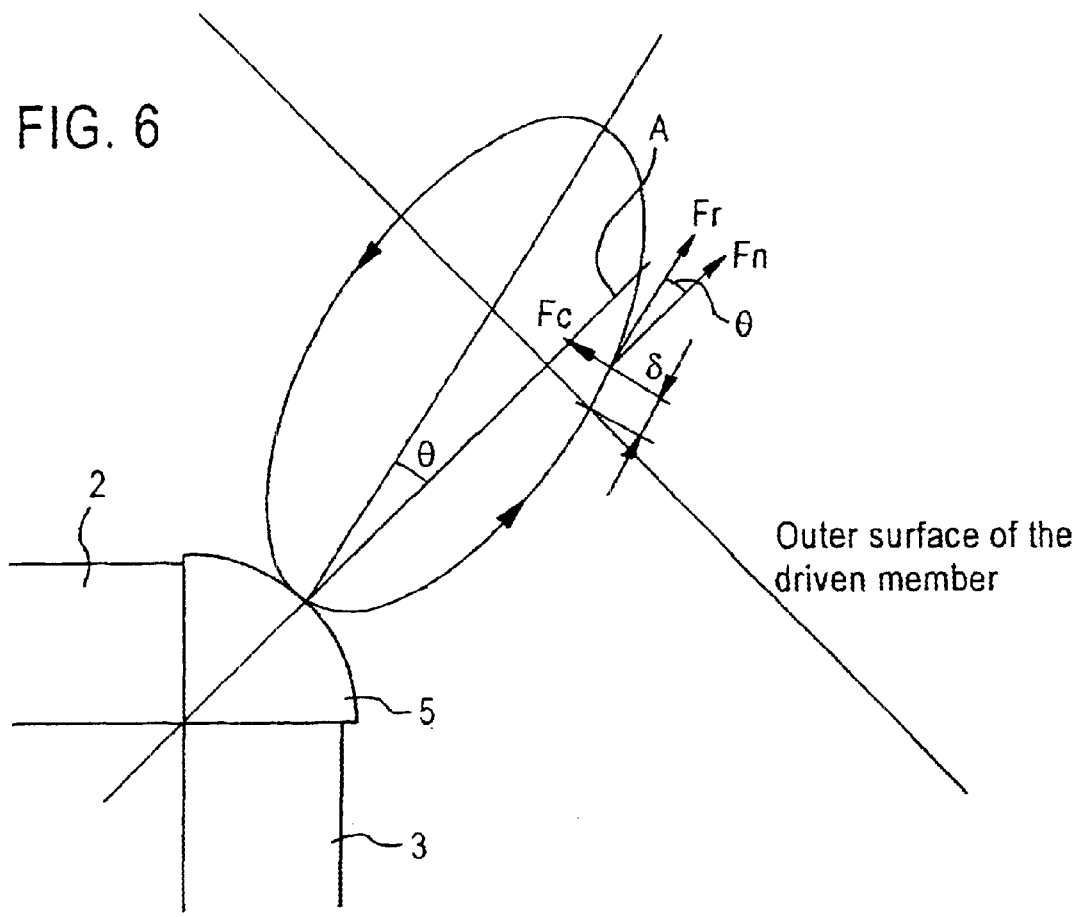
Figure 7:
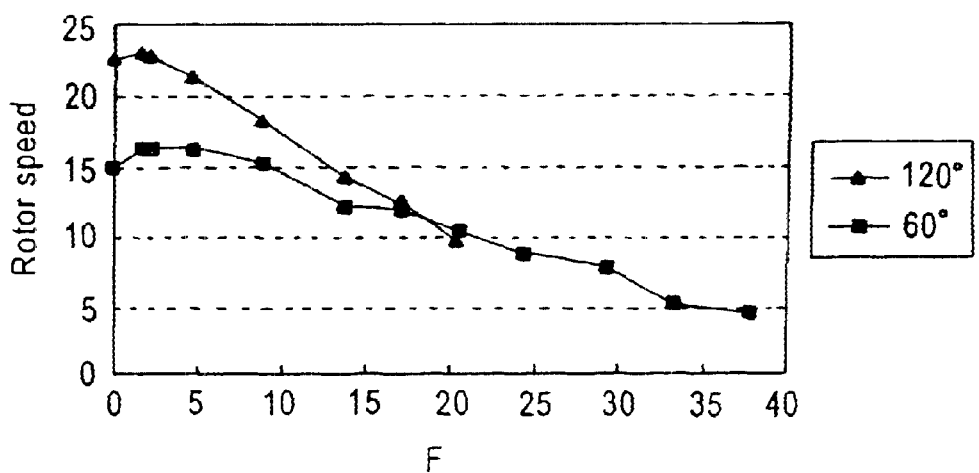
Figure 9:
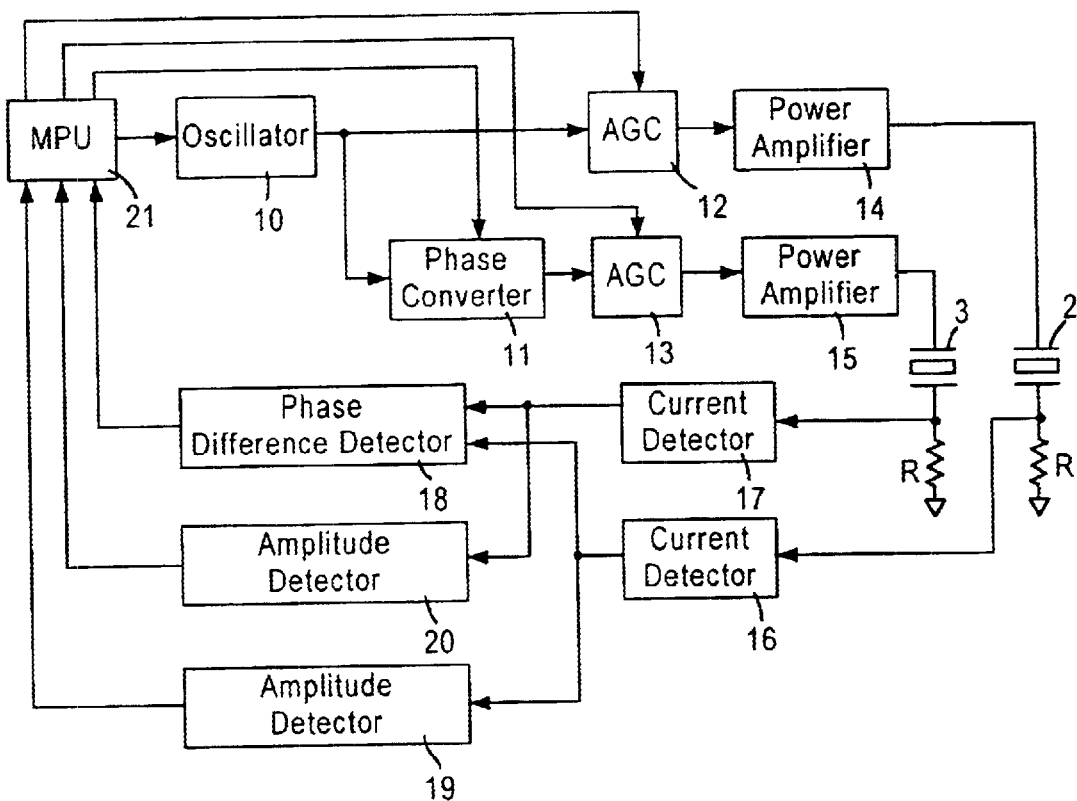
Figure 10:
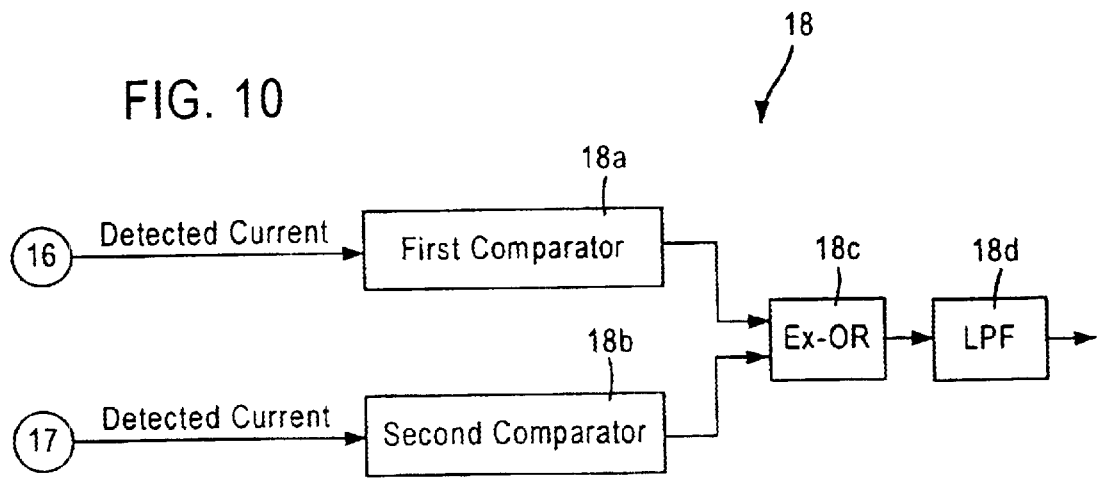
Figure 12:
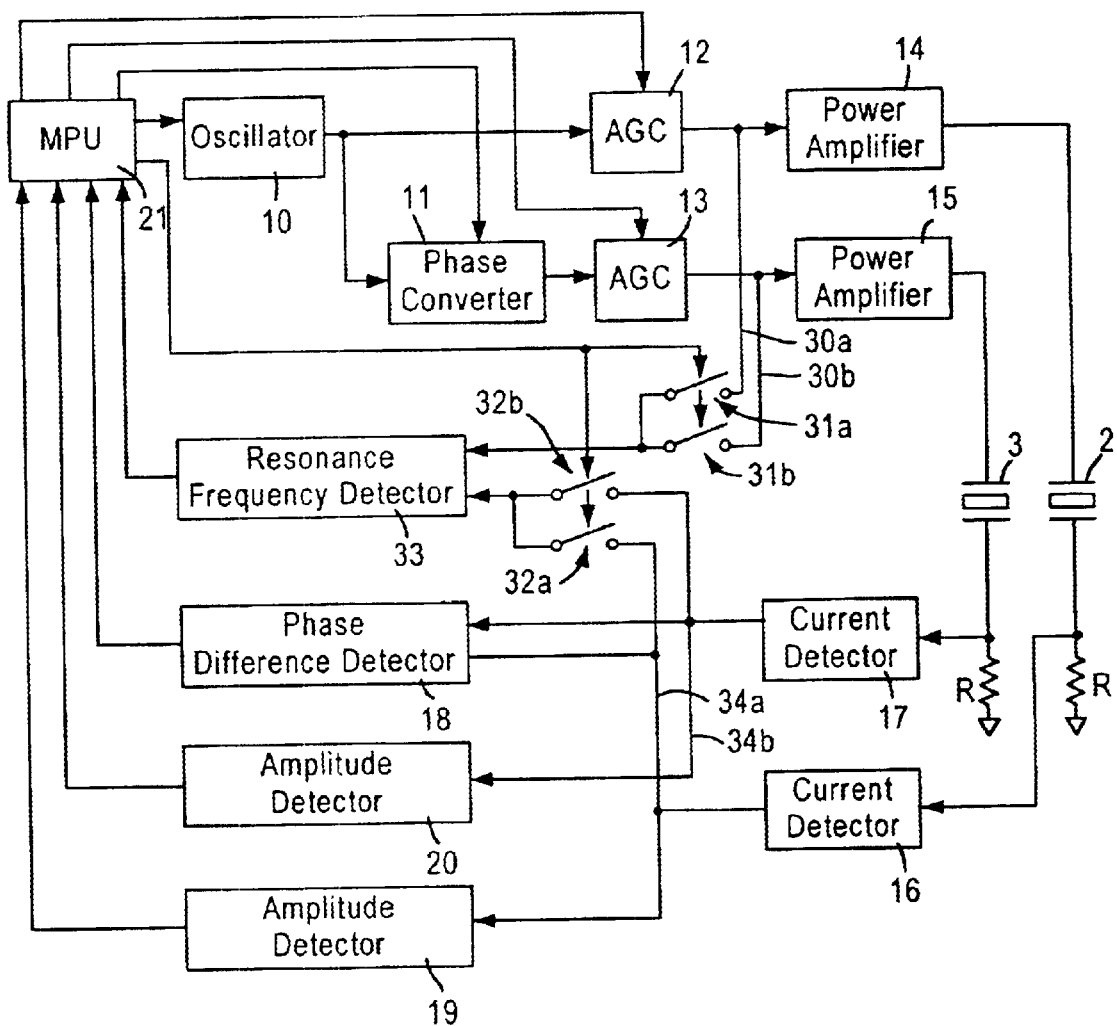
Figure 13:
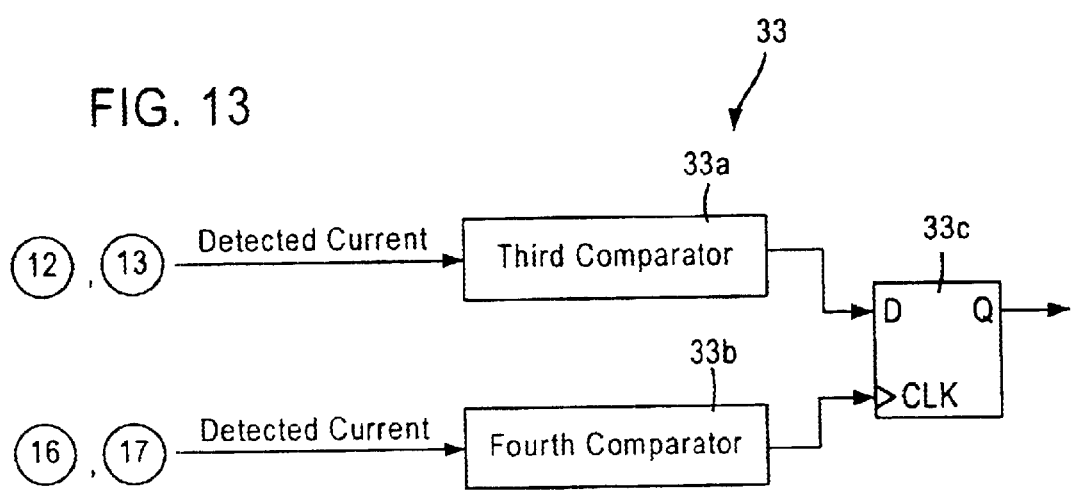
Figure 14:
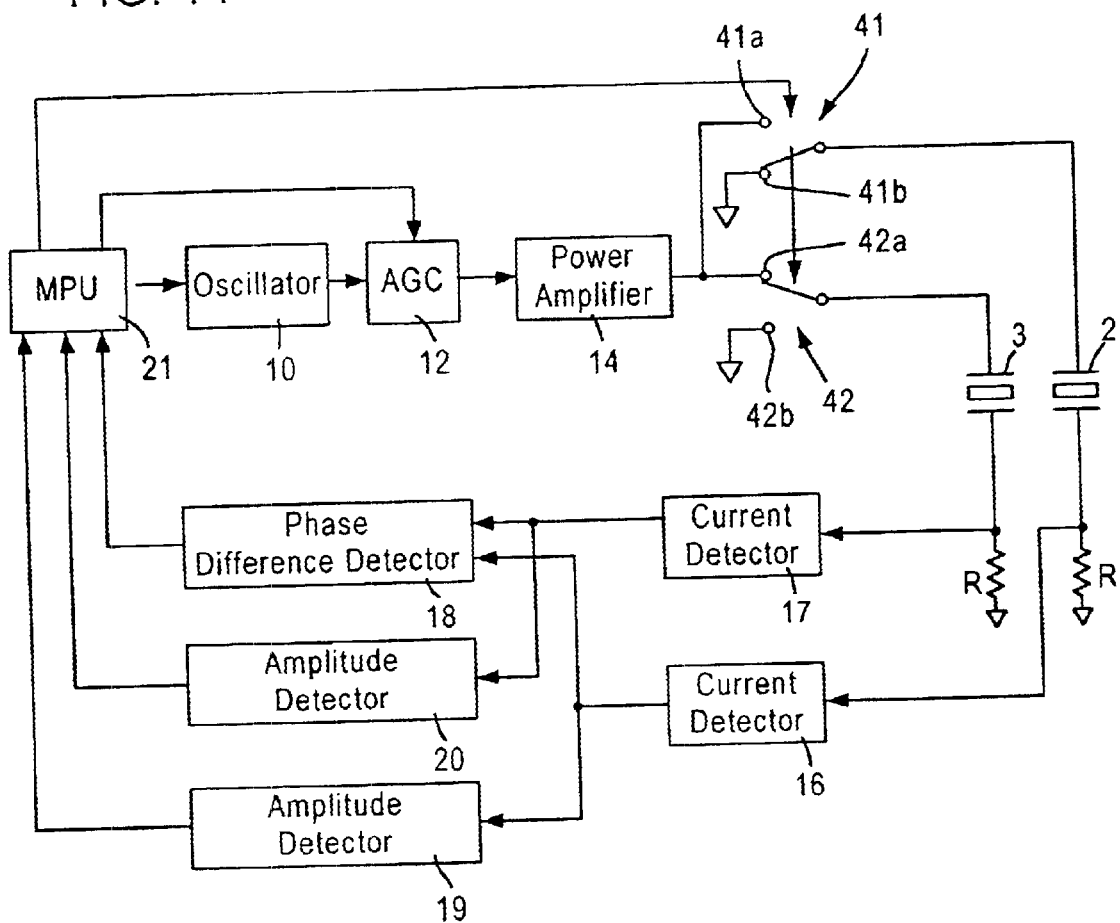
Figure 15:
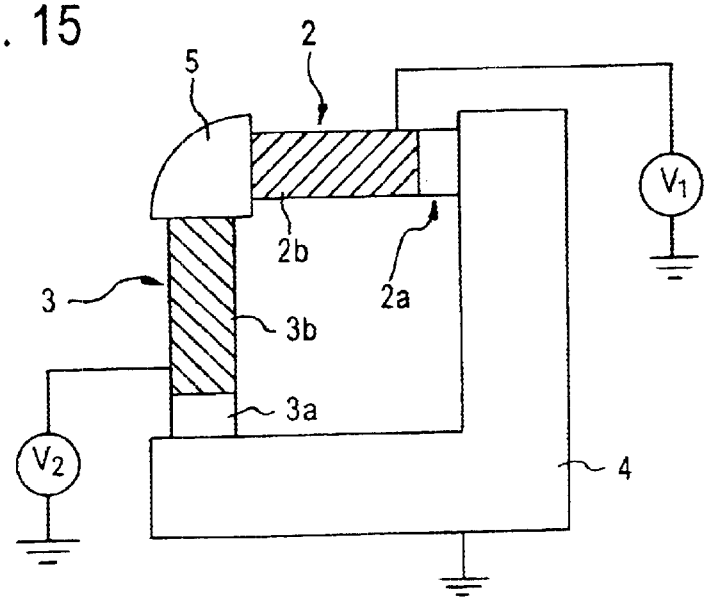

Part (a) of FIG. 2 is a front elevation showing the construction of a multi-layer piezoelectric element used as a displacement member incorporated in the truss-type actuator that is driven using the driving method of the present invention, and part (b) of FIG. 2 is a drawing showing the locus of the synthesizing member in which the distortion ratio and the electric field intensity have an essentially linear relationship;

FIG. 3 comprises drawings showing the loci of the synthesizing member that may be obtained when the phases of the two drive signals that drive the two displacement members comprising the truss-type actuator that is driven using the driving method of the present invention are changed, wherein part (a) shows the locus when the phase difference between the drive signals is 60°, part (b) shows the locus when the phase difference is 90°, and part (c) shows the locus when the phase difference is 120°;

FIG. 4 is a summary drawing to explain the size, flatness and gradient of the elliptical locus, which comprise the factors that may be used to adjust the locus of the synthesizing member;

FIG. 5 comprises drawings showing the loci that may be obtained when the amplitudes of the two drive signals that drive the two displacement members comprising the truss-type actuator in which the driving method of the present invention is applied are changed, wherein part (a) shows the locus when the phase difference is 60° and the amplitude of the drive signal of one displacement member is smaller than that of the drive signal of the other displacement member, part (b) shows the locus when the phase difference is 60° and the amplitude of the drive signal of one displacement member is larger than that of the drive signal of the other displacement member, (c) shows the locus when the phase difference is 120° and the amplitude of the drive signal of one displacement member is smaller than that of the drive signal of the other displacement member, and (d) shows the locus when the phase difference is 120° and the amplitude of the drive signal of one displacement member is larger than that of the drive signal of the other displacement member;

FIG. 6 corresponds to FIG. 5(a), and is a drawing to explain the driving when the phase difference is 60° and the amplitude of the drive signal of one displacement member is smaller than that of the drive signal of the other displacement member;

FIG. 7 is a drawing to explain the driving control performed using the driving method of the present invention;

FIG. 8 comprises drawings showing the drive loci and characteristics of the actuator used in the driving method of the present invention, wherein parts (a) and (b) show the results when the locus of the synthesizing member is changed such that the elliptical locus distances along the tangent line and the normal line of the rotor are essentially equal, and parts (c) and (d) show the corresponding characteristics;

FIG. 9 is a block diagram of a driving apparatus that implements the driving method of the present invention;

FIG. 10 is a block diagram showing the construction of the phase difference detector included in the driving apparatus shown in FIG. 9;

FIG. 11 comprises drawings showing the frequency characteristics when the actuator is subject to resonance driving using the present invention;

FIG. 12 is a block diagram of another driving apparatus that implements the driving method of the present invention;

FIG. 13 is a block diagram showing the construction of the resonance frequency detector included in the driving apparatus shown in FIG. 12;

FIG. 14 is a block diagram showing another driving apparatus that implements the driving method of the present invention; and FIG. 15 is a front elevation showing in a summary fashion the construction of another truss-type actuator driven using the driving method of the present invention.

In the following description, like parts are designated by like reference numbers throughout the several drawings.

DETAILED DESCRIPTION OF THE PREFERRED EMBODIMENTS

The embodiments of the present invention will be specifically explained below.

(First Embodiment)

Figure 1:
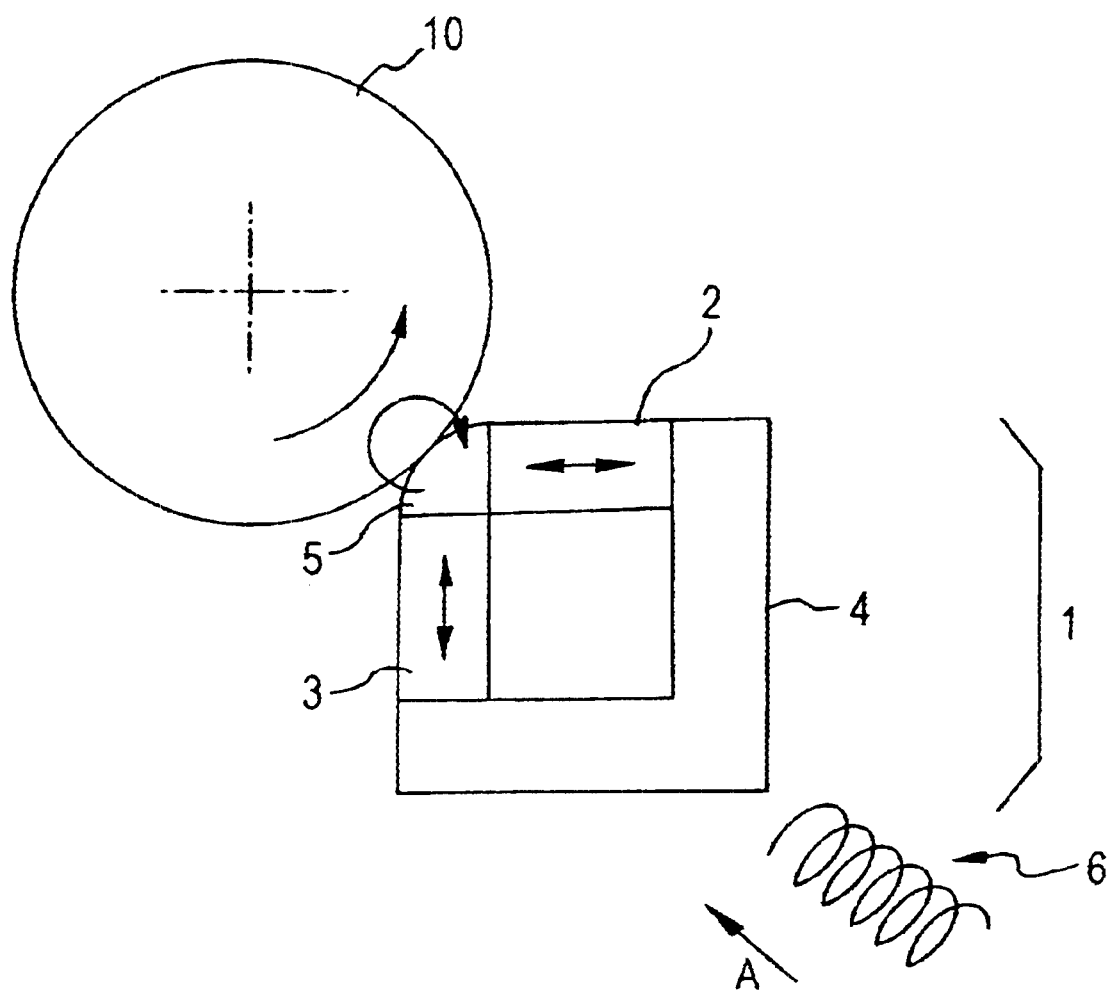
FIG. 1 is a front elevation showing in a summary fashion the construction of a truss-type actuator that is driven using the driving method of the present invention.

FIG. 1 shows the construction of a truss-type actuator that is driven using the driving method pertaining to the first embodiment.

This actuator comprises a driving unit 1 that drives the driven member 10, and a pressure unit 6 that keeps the driving unit 1 in pressure contact with the roller 10. The driving unit 1 comprises two displacement members 2 and 3, which are located such that they are angled by 90° from each other, for example, a synthesizing member 5 that is made to adhere at the crossing point of the displacement members 2 and 3, and a fixing member 4 that is made to adhere to the base ends of the displacement members 2 and 3.

The displacement members 2 and 3 comprise multi-layer piezoelectric elements that convert an electric signal into displacement via the piezoelectric effect. The synthesizing member 5 is formed of a fatigue-resistant metal material such as tungsten, using which a high frictional coefficient is obtained. The fixing member 4 is formed of a metal material such as stainless steel, which is easy to fabricate and has good strength. An epoxy resin adhesive agent, which is superior in terms of adhesive power and strength, is used for causing these members to adhere together. The pressure unit 6 comprises a coil spring or similar mechanism, and presses the fixing member 4 toward the center of the disk-like rotor 10 (i.e., in the direction of the arrow A), which comprises the driven member. The rotor 10 is made of a metal such as iron or aluminum, and the side surface thereof is subjected to surface treatment such as Tufftride or alumite treatment in order to prevent wear due to contact with the synthesizing member 5.

Figure 2A:
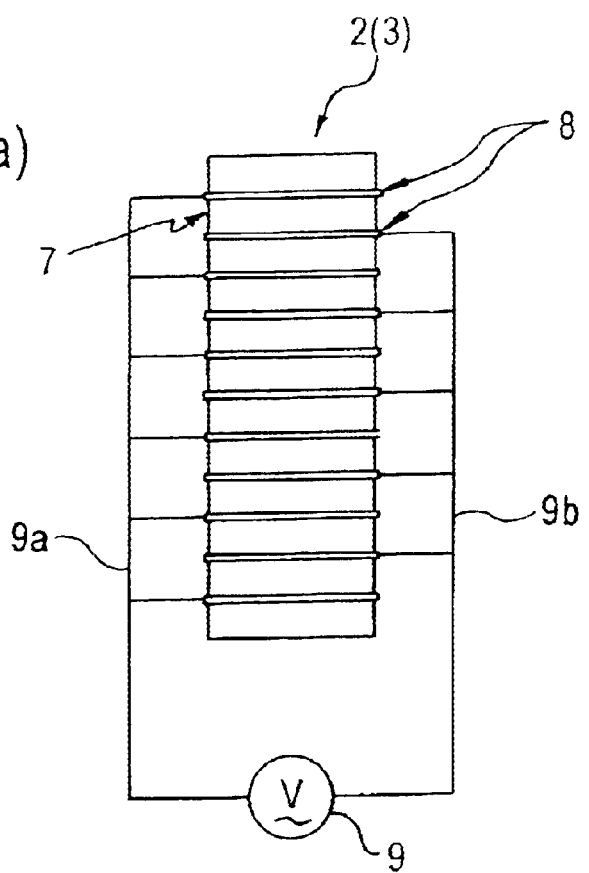

FIG. 2(a) shows the construction of the multi-layer piezoelectric element used as the displacement member 2 or 3.

This piezoelectric element 2 (or 3) comprises stacked piezoelectric layers 7, each of which comprises a thin plate formed from a material having a piezoelectric effect, such as PZT, for example, as well as metal electrodes 8, each of which is placed between two piezoelectric layers 7 and serves to provide an electric field, and each contact area is caused to adhere to another area using an adhesive agent. The piezoelectric layers 7 at both ends function as protective layers.

The electrodes 8 are connected to the signal lines 9a and 9b in an alternating fashion along the length of the element, and these signal lines 9a and 9b are connected to an external drive source 9. When a prescribed voltage is applied to the signal lines 9a and 9b, alternating electric fields are generated in the piezoelectric layers 7 along the length of the element. Each piezoelectric layer 7 is stacked such that the polarity of the electric field alternates between layers.

Figure 2B:
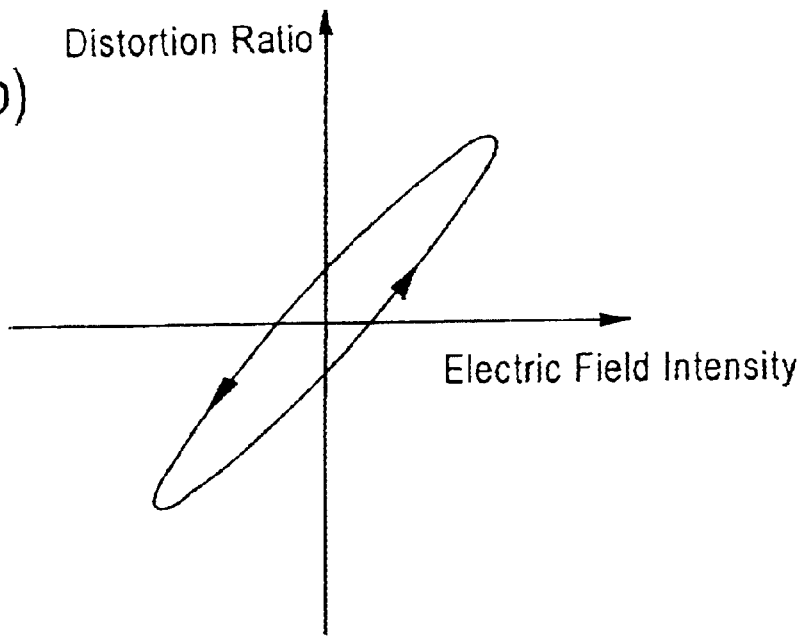

When a DC drive voltage is impressed to this piezoelectric element 2 (or 3) from an external source, for example, the piezoelectric layers 7 extend or contract together. The size of the electric field caused by an external source and the size of displacement have an essentially linear relationship, as shown in FIG. 2(b), in the range in which the electric field is small and the history of displacement may be ignored. On the other hand, if an AC voltage is impressed to the piezoelectric element 2 (or 3) from an external source, for example, the piezoelectric layers 7 repeat extension and contraction in accordance with the electric fields.

The piezoelectric elements 2 and 3 each have a unique resonance frequency that is determined by the construction or electric characteristics thereof, and when the frequency of the drive signal matches the resonance frequency, a resonance phenomenon occurs, in which the impedance declines and the displacement increases. Because the displacement of the piezoelectric element 2 or 3 is small in relation to the external dimensions thereof it is preferred that this resonance phenomenon be used in order to drive them using a low voltage.

When the amplitudes and phases of the drive signals to drive the two displacement members 2 and 3 are changed in this actuator, a locus regarding the movement of the synthesizing member 5 is obtained in accordance with the Lissajous expression.

(Adjustment of Flatness of Locus)

FIG. 3 comprises drawings showing the loci of the synthesizing member 5 that may be obtained when the phases of the two drive signals that drive the two displacement members 2 and 3 are changed. Part (a) shows the locus when the phase difference between the drive signals is 60°, part (b) shows the locus when the phase difference is 90°, and part (c) shows the locus when the phase difference is 120°.

As can be understood from FIG. 3, in this actuator, when the phase difference between the drive signals is made 90°, the locus of the synthesizing member 5 becomes a circle. In contrast, when the phase difference is made smaller than 90°, the locus of the synthesizing member 5 becomes an ellipsoid the longer diameter of which extends along the normal line A of the driven member, and when the phase difference is made larger than 90°, the locus of the synthesizing member 5 becomes an ellipsoid the longer diameter of which extends along the tangent line B of the driven member. In addition, as the phase difference deviates from 90° in either direction, the elliptical locus becomes flatter accordingly.

Therefore, by adjusting the phase difference, the flatness (a/b) of the locus of the synthesizing member 5 may be changed (see FIG. 4).

(Adjustment of Elliptical Locus in Longer (or Shorter) Diameter Direction)

FIG. 5 comprises drawings showing the loci that are obtained when the amplitudes of the drive signals are also changed in addition to the phase difference. Part (a) shows the locus when the phase difference is 60° and the amplitude of the drive signal of the displacement member 2 is smaller than that of the drive signal of the displacement member 3, part (b) shows the locus when the phase difference is 60° and the amplitude of the drive signal of the displacement member 2 is larger than that of the drive signal of the displacement member 3, part (c) shows the locus when the phase difference is 120° and the amplitude of the drive signal of the displacement member 2 is smaller than that of the drive signal of the displacement member 3, and part (d) shows the locus when the phase difference is 120° and the amplitude of the drive signal of the displacement member 2 is larger than that of the drive signal of the displacement member 3.

As can be understood from FIG. 5, where the phase difference is 60°, if the amplitude of the drive signal for the displacement member 2 is made smaller than that of the drive signal for the displacement member 3, the longer diameter of the elliptical locus of the synthesizing member 5 shifts toward the displacement member 2 from the position that runs along the normal line A of the driven member, and if the amplitude of the drive signal for the displacement member 3 is made smaller than that of the drive signal for the displacement member 2, the longer diameter of the elliptical locus of the synthesizing member 5 shifts toward the displacement member 3 from the position that runs along the normal line A of the driven member.

Where the phase difference is 120°, if the amplitude of the drive signal for the displacement member 2 is made smaller than that of the drive signal for the displacement member 3, the shorter diameter of the elliptical locus of the synthesizing member 5 shifts toward the displacement member 3 from the position that runs along the normal line A of the driven member, and if the amplitude of the drive signal for the displacement member 3 is made smaller than that of the drive signal for the displacement member 2, the shorter diameter of the elliptical locus of the synthesizing member 5 shifts toward the displacement member 2 from the position that runs along the normal line A of the driven member.

Therefore, by changing the amplitudes in addition to the phase difference, the direction in which the longer (or shorter) (c in FIG. 4) diameter of the elliptical locus of the synthesizing member 5 extends may be changed.

(Size of Elliptical Locus)

The size of the elliptical locus (a+b in FIG. 4) naturally may be changed by adjusting the voltages.

As described above, in the present invention, the size (a+b) of the oval may be adjusted by changing the amplitudes, the flatness (a/b) of the oval may be adjusted by changing the phase difference, and the gradient (c) of the oval may be adjusted by changing the amplitudes and the phase difference, as shown in FIG. 4.

(Drive Force Control)

The drive force control used in the present invention will now be explained.

FIG. 6 corresponds to FIG. 5(a), and is a drawing to explain the driving when the phase difference is 60° and the amplitude of the drive signal for the displacement member 2 is made smaller than that of the drive signal for the displacement member 3.

In the case of this driving, as described above, the longer diameter of the elliptical locus of the synthesizing member 5 becomes angled by an angle θ relative to the normal line A of the driven member. When the actuator is driven in this way, because the synthesizing member 5 is in pressure contact with the driven member due to the pressing force from the pressure unit, the driven member is deformed by σ. The force Fr exerted by the synthesizing member 5 on the driven member in this situation is expressed by the following equation (1).

$$Fr = kr \times \sigma \tag{1}$$

where kr is a spring constant sought from the elastic modulus of the driven member.

Here, the force Ft that runs along the outer surface of the driven member and drives the driven member is expressed by the following equation (2).

$$Ft = Fr \times \sin\theta \tag{2}$$

Therefore, the driving force Ft is a function of θ, and as described above, by changing the angle θ through the change of the phase difference between the displacement members 2 and 3 and the amplitudes of the drive signals applied thereto, the driving force of the actuator may be controlled.

Specific explanations are provided below.

FIG. 7 shows the results of experimentation regarding the driving characteristics in which the displacement members 2 and 3 are driven using the same amplitude of oscillation but the phase difference therebetween was changed. Namely, the phase difference was 60° or 120°. The horizontal axis represents the driving force (F) of the actuator and the vertical axis represents the rotor speed. The drive frequency was 25 kHz and the displacement members 2 and 3 were driven based on non-resonance driving. The driving voltage for each displacement member 2 and 3 was 50Vp-p, and the pressing force from the pressure unit 6 was 300 gf. The locus was elongated along the normal line A when the phase difference was 60°, as shown in FIG. 3(a), and it was elongated along the tangent line B when the phase difference was 120°, as shown in FIG. 3(c).

As can be understood from FIG. 7 and the loci, the driving force/speed characteristic is 'low speed, high torque' when the phase difference is 60° and 'high speed, low torque' when the phase difference is 120°. Therefore, based on these results, the present invention uses a method in which driving is initially performed using a 60° phase difference, but once speed is established, switches to driving using a 120° phase difference.

However, it is preferred that the following be avoided when carrying out the above drive control.

FIG. 8 shows the results of experimentation regarding the relationship between the locus and the driving characteristics when the amplitudes of the displacement members 2 and 3 were changed in various ways while the oscillation phase difference between them was maintained at 90°.

Parts (a) and (b) of FIG. 8 show the elliptical loci of the synthesizing member. The configuration (or size) of the elliptical locus changes depending on the load. Here, experimentation was carried out such that the size of the elliptical locus, namely, the diameters thereof along the tangent line (i.e., the vertical axis) and the normal line (i.e., the horizontal axis) of the rotor were essentially the same with each load. The unit of measurement for the numbers in the drawings is μm.

Figure 8A:
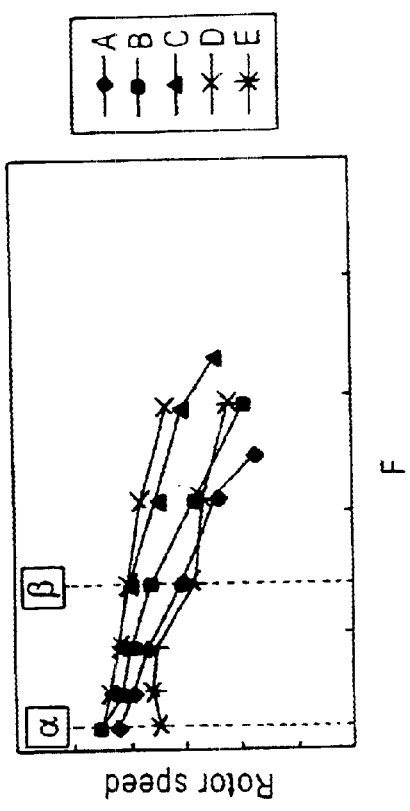
Figure 8C:
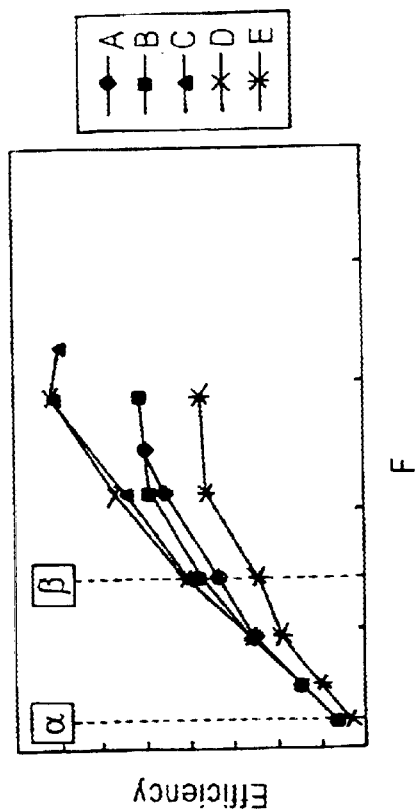
Figure 8B:
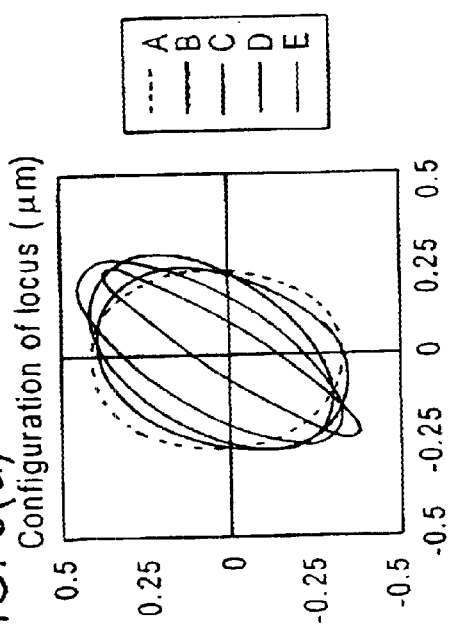
Figure 8D:
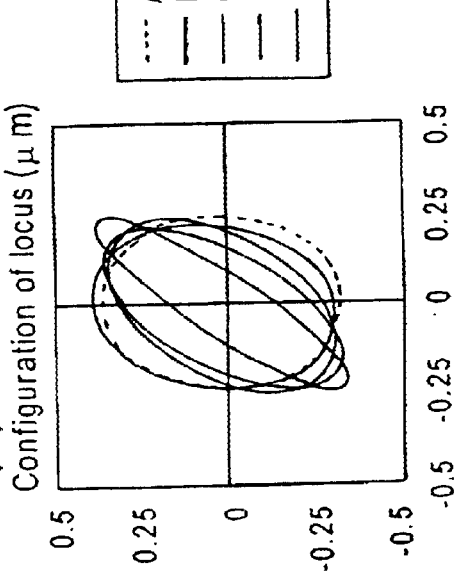

FIG. 8(c) is a characteristic chart obtained when the locus was changed in this way. The horizontal axis represents the driving force (F) of the actuator and the vertical axis represents the speed of the rotor. The pressing force from the pressure unit 6 was exerted in the direction toward the right along the horizontal axis in parts (a) and (b) of FIG. 8. FIG. 8(d) is also a characteristic chart when the locus was changed in this way. The horizontal axis represents the driving force (F) of the actuator and the vertical axis represents the efficiency. α in parts (c) and (d) of FIG. 8 indicates the time at which the loci shown in FIG. 8(a) were present, and β indicates the time at which the loci shown in FIG. 8(b) were present. A, B, C, D and E in parts (a) through (d) of FIG. 8 indicate that different driving parameters were used.

As can be understood from FIG. 8, both output and efficiency can improve when driving is performed such that the shorter diameter of the elliptical locus is angled relative to the normal line of the rotor, as in the driving conditions B and C in the drawings, as compared with the case in which driving is performed such that the longer diameter matches the tangent line of the rotor, as in the driving condition A. However, as shown by the driving condition E in the drawings, when the shorter diameter of the elliptical locus is too small, the synthesizing member oscillates in a linear manner rather than in an elliptical motion, resulting in a driving method in which the synthesizing member only bumps into the driven member. In such a situation, the output and efficiency characteristics drop.

Therefore, it is preferred in the present invention that at least either the phase difference or the amplitudes be adjusted during driving, such that the locus comprises an elliptical locus, the shorter diameter of which is angled to the normal line of the rotor, while it is ensured that the shorter diameter of the elliptical locus is not too small.

FIG. 9 shows a block diagram of a driving apparatus that implements the driving method of the first embodiment.

This driving apparatus has an AGC (Auto Gain Controller) 12 that directly inputs the drive signal from the oscillator 10, which can change its oscillation frequency, amplifies the drive signal and outputs the amplified signal to the displacement member 2, a power amplifier 14, an AGC 13 that amplifies the drive signal from the oscillator 10 after it passes through the phase converter 11, and outputs the resulting signal to the displacement member 3, a power amplifier 15, a current detector 16 that detects the electric current drawn to the displacement member 2, a current detector 17 that detects the electric current drawn to the displacement member 3, a phase difference detector 18 that inputs the detection signals from the current detectors 16 and 17 and detects the phase difference, an amplitude detector 19 that inputs the detection signal from the current detector 16 and detects the amplitude, an amplitude detector 20 that inputs the detection signal from the current detector 17 and detects the amplitude, and an MPU (Microprocessing Unit) 21 that inputs the detection signals from the current detector 16 and the amplitude detectors 19 and 20 and controls the phase converter 11 and the AGCs 12 and 13. The MPU 21 also performs control to change the oscillation frequency of the oscillator 10.

The phase difference detector 18 comprises, as shown in FIG. 10, a first comparator 18a that inputs the detected current value from the current detector 16, a second comparator 18b that inputs the detected current value from the current detector 17, an Ex-OR circuit 18c that inputs the signals from the comparators 18a and 18b, and an LPF (Low Pass Filter) 18d.

In this driving apparatus, the current detectors 16 and 17 detect the currents drawn to the displacement members 2 and 3, respectively, based on the voltage drop in the resistor R that is serially inserted in each displacement member. The phase difference detector 18 forms the detection signals from the current detectors 16 and 17 into square waves via the comparators 18a and 18b, respectively, outputs via the Ex-OR circuit 18c the square waves having a duty ratio corresponding to the phase difference, and detects the phase difference through smoothing performed by the LPF 18d.

The amplitude detectors 19 and 20 detect the amplitudes based on the detection signals from the current detectors 16 and 17.

The MPU 21 includes a memory in which are stored in advance the target phase differences and target amplitudes from which the target locus for the actuator may be obtained. The MPU 21 reads the target phase difference and target amplitudes from the memory, compares the phase difference detected by the phase difference detector 18 with the target phase difference, and if there is a difference between the two, adjusts the conversion amount using the phase converter 11 so that the difference will be eliminated. It also compares the amplitudes detected by the amplitude detectors 19 and 20 and the target amplitudes, respectively, and if there is a difference, it adjust the oscillation amplitude or amplitudes of one or both of the AGCs 12 and 13 so that the difference will be eliminated. The MPU 21 includes a digital/analog converter.

Using this driving apparatus, the driving locus of the actuator, i.e., the locus of the motion of the synthesizing member 5, may be matched to the target locus, such that the desired driving characteristics may be obtained. In addition, if the target amplitudes and target phase difference by which low speed and high torque are obtained for the beginning of driving and the target amplitudes and target phase difference by which high speed and low torque are obtained for regular driving after the speed is established are stored in the memory in such a manner that they are associated with the timing at which switching should be carried out, smooth driving through regular driving may be obtained from the beginning.

For the oscillator 10, a voltage controlled oscillator (VCO), a direct digital synthesizer (DDS) or a numerically controlled oscillator (NCO) may be used, for example. For the amplitude detectors 19 and 20, peak detectors, P—P detectors or effective value detectors may be used.

(Second Embodiment)

The situation in which the two displacement members 2 and 3 are driven using a non-resonance mode was explained in connection with the first embodiment. Comparing driving using a non-resonance mode and driving using a resonance mode, the latter resonance mode driving offers the advantages of being more efficient and permitting driving using a low voltage. Therefore, a situation in which driving is performed using a resonance mode will be explained in connection with the second embodiment.

In order to perform driving using a resonance mode, it must be detected whether or not the drive frequency is a resonance frequency. This detection may be carried out through a comparison of the phase of the driving voltage for each displacement member to be driven and the electric current drawn thereto.

Figure 11A:
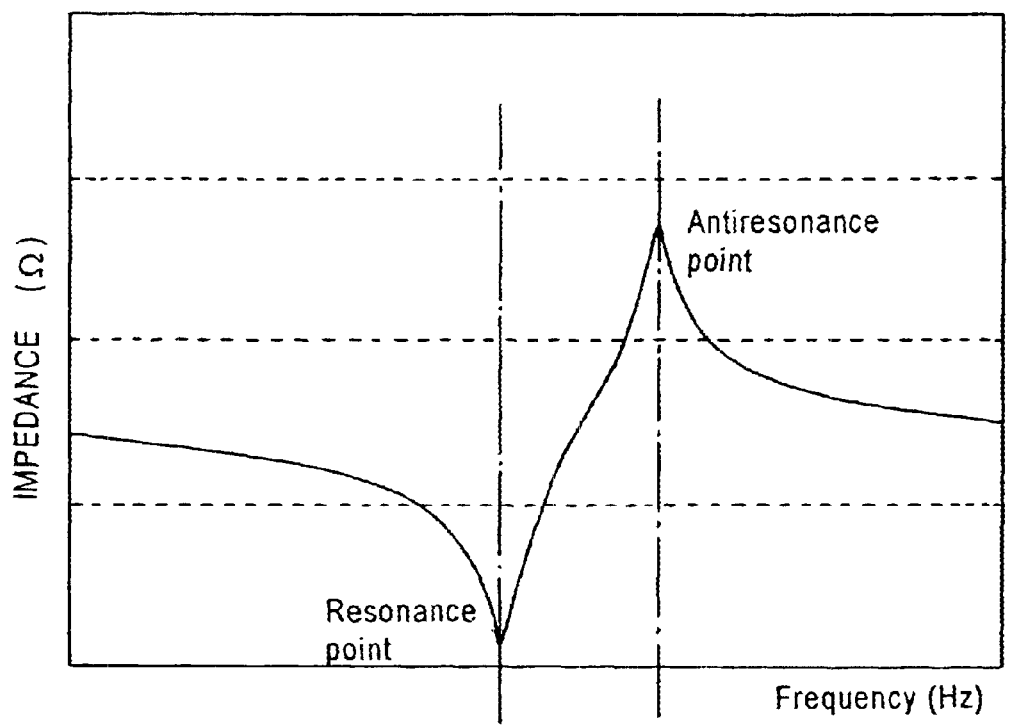
Figure 11B:
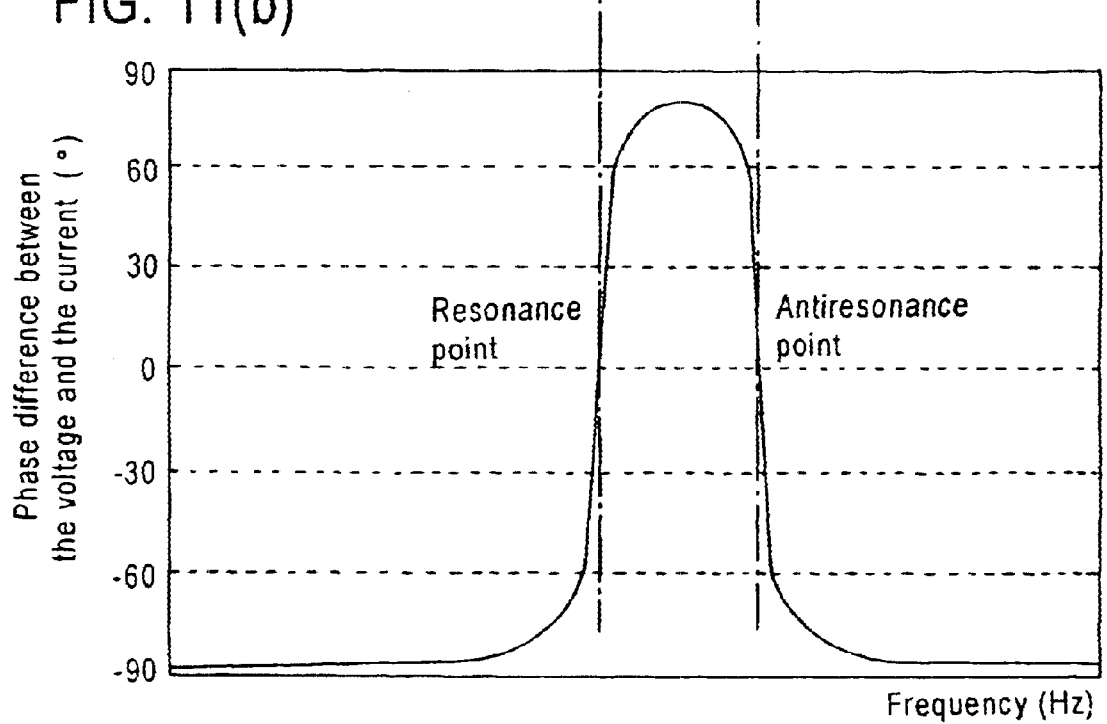

FIG. 11(a) is a drawing showing the relationship between the frequency (Hz) and the impedance (Q), and FIG. 11(b) is a drawing showing the relationship between the frequency (Hz) and the phase difference (°) between the voltage and the current.

At the frequencies at the resonance point and the antiresonance point, the phase difference between the drive voltage and the current for the displacement member becomes 0°. In contrast, at frequencies lower than the resonance point, the phase of the current waveform is more advanced than the voltage waveform, while at frequencies between the resonance point and the antiresonance point, the phase of the current waveform lags behind the voltage waveform.

FIG. 12 shows a block diagram of a driving apparatus that implements the driving method of the second embodiment. In this FIG. 12, identical members have the same numbers shown in FIG. 9 pertaining to the first embodiment.

Only the differences from the circuit construction for the first embodiment will be explained. A bifurcation line 30a extends from between the AGC 12 and the power amplifier 14, and a bifurcation line 30b extends from between the AGC 13 and the power amplifier 15. Open/close switches 31a and 31b are located on the bifurcation lines 30a and 30b, respectively. The bifurcation lines 30a and 30b are combined towards the ends thereof and are connected to a resonance frequency detector 33. A bifurcation line 34a extends from between the current detector 16 and the phase difference detector 18, and a bifurcation line 34b extends from between the current detector 17 and the phase difference detector 18. Open/close switches 32a and 32b are located on the bifurcation lines 34a and 34b, respectively. The bifurcation lines 34a and 34b are combined into one line toward the ends thereof and are connected to the resonance frequency detector 33. The output from the resonance frequency detector 33 is supplied to the MPU 21. The open/close switches 31a and 32a are 'closed' when the phase difference between the driving voltage and the current of the displacement member 2 is being detected, and are 'open' otherwise. The open/close switches 31b and 32b are 'closed' when the phase difference between the driving voltage and the current of the displacement member 3 is being detected, and are 'open' otherwise.

The resonance frequency detector 33 comprises, as shown in FIG. 13, for example, a third comparator 33a that inputs the output voltage from the AGC 12 or 13, a fourth comparator 33b that inputs the current value detected by the current detector 16 or 17, and a D flip-flop circuit 33c that has a D terminal that inputs the output signal from the third comparator 33a, a CLK terminal that inputs the output signal from the fourth comparator 33b and a Q terminal for output.

In this driving apparatus, when the resonance frequency of the displacement member 2 is being detected, the oscillator 10 is made to oscillate, the open/close switches 31a and 32a are 'closed', and the output voltage waveform of the AGC 12 and detected voltage waveform of the current detector 16 are made square waveforms via the comparators 33a and 33b of the resonance frequency detector 33. The D flip-flop circuit 33c inputs these signals from the prescribed terminal, and outputs from the Q terminal a low-level signal (0) for frequencies lower than the resonance frequency, and a high-level signal (1) for frequencies between the resonance point and the antiresonance point. When the resonance frequency of the displacement member 3 is being detected, the oscillator 10 is made to oscillate, the open/close switches 31b and 32b are 'closed', and the output voltage waveform of the AGC 13 and detected voltage waveform of the current detector 17 are made square waveforms via the comparators 33a and 33b of the resonance frequency detector 33. The D flip-flop circuit 33c inputs these signals from the prescribed terminal, and outputs from the Q terminal a low-level signal (0) for frequencies lower than the resonance frequency, and a high-level signal (1) for frequencies between the resonance point and the antiresonance point.

A first frequency that increases the oscillation frequency of the oscillator 10 by a certain value when a low-level signal (0) is input and a second frequency that reduces the oscillation frequency of the oscillator 10 by a certain value when a high-level signal (1) is input are stored in the memory of the MPU 21, which receives the signal, for example. As in the first embodiment, the target phase differences and target amplitudes by which the target locus for the actuator is obtained are also stored in the memory.

The MPU 21 reads the information stored in the memory, adjusts the oscillation frequency of the oscillator 10 such that it increases by the first frequency when a low-level signal (0) is input, and such that it decreases by the second frequency when a high-level signal (1) is input. Through this adjustment, the oscillation frequency of the oscillator 10 is adjusted such that it approaches the resonance frequency. When this is performed, if a large value is set for the first frequency and the second frequency, the drive frequency fluctuates substantially between the high frequency side and the low frequency side across the resonance frequency, making it difficult for it to converge on the resonance frequency. Therefore, it is preferred that an appropriate small value be set, such that the drive frequency gradually approaches the resonance frequency. It is also preferred that the MPU 21 be set such that it stops the frequency adjustment once the frequency falls within a certain frequency range close to the resonance frequency, or such that if the frequency was increased by the first frequency (or reduced by the second frequency) in the previous adjustment, and was reduced by the second frequency (or increased by the first frequency) in the current adjustment, the frequency adjustment is stopped after the current adjustment.

Consequently, the two displacement members 2 and 3 are efficiently driven using a resonance mode. In addition, after this frequency adjustment, the MPU 21 adjusts the phase difference via the phase converter 11 when there is a difference between the detected phase difference detected by the phase difference detector 18 and the target phase difference, and performs level adjustment of the AGC 12 or 13 when there is a difference between the amplitude detected by the amplitude detector 19 or 20 and the target amplitude, so that the driving locus of the actuator, i.e., the locus of the motion of the synthesizing member 5, may be matched to the target locus and the desired driving characteristics obtained, as in the first embodiment. In addition, if the target amplitudes and target phase difference by which low speed and high torque are obtained for the beginning of driving and the target amplitudes and target phase difference by which high speed and low torque are obtained for regular driving after the speed is established, are stored in the memory in such a manner that they are associated with the timing at which switching should be carried out, smooth driving through regular driving may be obtained from the beginning. The open/close switches 31a and 32a or 31b and 32b may be changed from 'closed' to 'open' any time after the completion of the frequency adjustment.

(Third Embodiment)

In the first and second embodiments described above, both of the two displacement members are driven at the same time, but the present invention is not limited to this implementation, and may be applied in a situation in which only one displacement member is driven. A specific example in which only one displacement member is driven will be explained in connection with a third embodiment.

FIG. 14 is a block diagram showing a driving apparatus pertaining to the third embodiment.

This driving apparatus has an AGC 12 that directly inputs the drive signal from the oscillator 10 and amplifies it, as well as a power amplifier 14. Subsequent to the power amplifier 14 are located alternating switches 41 and 42 to supply the drive signal to either of the displacement members 2 and 3. The alternating switch 41 may be connected to the terminal 41a or the terminal 41b, and the alternating switch 42 may be connected to the terminal 42a or the terminal 42b. The output from the power amplifier 14 is supplied to the terminals 41a and 42a, and the terminals 41b and 42b are grounded.

The switching of these alternating switches 41 and 42 is synchronously controlled by the MPU 21. When the alternating switch 41 is connected to the terminal 41a, the alternating switch 42 is connected to the terminal 42b in a synchronous fashion such that only the displacement member 2 will be driven. If the alternating switch 41 is connected to the terminal 41b, the alternating switch 42 is connected to the terminal 42a in a synchronous fashion such that only the displacement member 3 will be driven.

Using this driving apparatus, the connections of the alternating switches 41 and 42 are changed such that only one displacement member, i.e., the displacement member 2 only, for example, will be driven. The current regarding the displacement member 2 is then detected by the current detector 16, and the current regarding the displacement member 3, which is caused by the oscillation thereof based on the driving of the displacement member 2, is detected by the current detector 17. Based on the values detected by the current detectors 16 and 17, the phase difference detector 18 detects the phase difference therebetween, and the amplitude detectors 19 and 20 detect the amplitudes based on the values detected by the current detectors 16 and 17. The MPU 21 adjusts the oscillation frequency of the oscillator 10 when there is a difference between the detected phase difference and the target phase difference, and adjusts the level of the AGC 12 when there is a difference between the detected amplitudes and the target amplitudes.

Therefore, using this third embodiment, the driving locus of the actuator, i.e., the locus of the motion of the synthesizing member 5, may be matched to the target locus, and the desired driving characteristics may be obtained. In addition, if the target amplitudes and target phase difference by which low speed and high torque are obtained for the beginning of driving and the target amplitudes and target phase difference by which high speed and low torque are obtained for regular driving after the speed is established are stored in the memory in such a manner that they are associated with the timing at which switching should be carried out, smooth driving through regular driving may be obtained from the beginning. However, using the third embodiment, because only one of the displacement members 2 and 3, i.e., only the displacement members 2, is driven in the above explanation, there is some limitation in the control of the locus in comparison with the first and second embodiments described above.

(Modification)

In the first through third embodiments, the multi-layer piezoelectric elements that comprise the displacement members may be driven using drive signals having rectangular waves. In this case, however, because pulses may occur in the current of each driven multi-layer piezoelectric element and phase detection may not be accurately performed, it is preferred that distortion gauges be attached to the displacement members using an adhesive agent such that the displacement is measured by the distortion gauge.

In addition, in the first through third embodiments, multi-layer piezoelectric elements are used for the displacement members, but the present invention is not limited to this implementation. The displacement members may comprise piezoelectric elements and elastic members as well.

FIG. 15 is a front elevation showing in a summary fashion a truss-type actuator including displacement members that comprise multi-layer piezoelectric elements and elastic members. The displacement members 2 and 3 each comprise a single-layer piezoelectric element 2a and 3a, respectively, as well as metal elastic members 2b and 3b, that are serially connected to the piezoelectric elements.

Using an actuator having this construction, the same effect may be obtained that is obtained with an actuator using multi-layer piezoelectric elements for the displacement members, and the following advantages are also obtained. In general, a piezoelectric element is made of a ceramic material, and in comparison with metal, the attenuation of oscillation for such a material is large and the displacement magnification during resonance is small. In addition, ceramics are resistant to compressive force but not to tensile force, and in particular, because there are a number of adherent surfaces in a multi-layer piezoelectric element, the problem exists that the layers may become peeled off. Using the third embodiment, however, this problem may be resolved.

Furthermore, in the first through third embodiments, a situation involving two displacement members, i.e., the displacement members 2 and 3, was shown. However, the number of displacement members is not limited to two in the present invention, which may be applied when there are three or more displacement members.

In the first through third embodiments, the target amplitudes and the target phase differences are stored in the memory and associated with a switch timing that divides the driving into a beginning phase and a regular driving phase, but the present invention is not limited to this implementation. More switch timings, which further create multiple phases between the beginning phase and the regular driving phase, or which divide the regular driving phase into multiple different phases, may be established, for example.

Moreover, explanations were provided in connection with the above embodiments using as an example of the driven member a round rotor that rotates, but the present invention is not limited to this implementation. The present invention may be applied in the same manner with an oval rotor or a straight-moving slider as well. Where the driven member is an oval rotor, the shorter diameter or the longer diameter of the elliptical locus of the synthesizing member should be angled relative to the normal line of the rotor. Where the slider is a plate-like slider, the shorter diameter or the longer diameter of the elliptical locus of the synthesizing member should be angled relative to the thickness of the slider. Where the surface of the slider that is in contact with the synthesizing member is a flat surface, the shorter diameter or the longer diameter of the elliptical locus of the synthesizing member should be angled relative to a plane perpendicular to the contact surface.

In the above embodiments, explanations were provided using examples in which piezoelectric elements were used for the displacement members, but the present invention is not limited to this implementation. Magnetostrictive elements or other electromechanical energy conversion elements may be used instead.

As described in detail above, using the method of the present invention, the amplitude of each displacement member and the phase difference therebetween, which pertain to the elliptical locus of the synthesizing member, are detected, and the locus of the synthesizing member is adjusted based on the results of such detection, and consequently, the desired driving characteristics may be obtained.

Furthermore, using the apparatus of the present invention, based on the amplitude of each displacement member and the phase difference therebetween detected by the detecting means, the locus adjusting means changes at least either the amplitudes, which are adjusted by the amplitude controller, or the phase difference, which is adjusted by the phase difference controller, to adjust the elliptical locus of the synthesizing member, enabling the desired driving characteristics to be obtained.

Although the present invention has been fully described by way of examples with reference to the accompanying drawings, it is to be noted that various changes and modifications will be apparent to those skilled in the art. Therefore, unless such changes and modification depart from the scope of the present invention, they should be construed as being included therein.

What is claimed is:

1. A driving apparatus comprising:
    a base;
    multiple displacement members, the base ends of which are fixed to the base and the tip ends of which are combined at one location, said displacement members generating a prescribed displacement,
    a pressure unit that keeps the synthesizing member, at which the tip ends of the displacement members are combined, in pressure contact with the driven member, which comprises the object of driving;
    a driving circuit that impresses drive signals to the displacement members;
    a controller that controls the driving circuit so that the synthesizing member moves in an elliptical path and the drive force is transmitted to the driven member, and
    a first detector that detects the amplitudes of the displacement members and the phase difference therebetween,
    wherein based on the results of detection by the detectors, the amplitudes or phases of the voltages impressed to the displacement members are changed to adjust the elliptical locus of the synthesizing member.

2. A driving apparatus according to claim 1,
    wherein the controller changes the phases of the impressed voltages to adjust the flatness of the elliptical locus.

3. A driving apparatus according to claim 1,
    wherein the controller changes the amplitudes and phases of the impressed voltages to adjust the direction of the elliptical locus.

4. A driving apparatus according to claim 1,
    wherein the controller changes the amplitudes and phases of the impressed voltages to adjust the drive force transmitted to the driven member.

5. A driving apparatus according to claim 1,
    wherein the phases of the impressed voltages when the driven member begins to move are different from such phases at other times.

6. A driving apparatus according to claim 5, wherein the phases is changed such that the driving characteristics include low speed and high torque when the driven member begins to move, while including high speed and low torque otherwise.

7. A driving apparatus according to claim 1, further comprising a memory means that stores the target amplitudes and target phase differences that correspond to the target elliptical locus of the synthesizing member, wherein the controller changes at least either the amplitudes or phases of the impressed voltages so that the difference between the amplitudes detected by the first detector and the target amplitudes stored in the memory means and the difference between the phase difference detected by the first detector and the target phase difference stored in the memory means are eliminated.

8. A driving apparatus according to claim 7, wherein the memory means stores multiple target amplitudes and phase differences that correspond to the target elliptical locus of the synthesizing member in such a manner that they are associated with a timing at which the parameters of the elliptical movement should be changed.

9. A driving apparatus according to claim 8, wherein the elliptical movement when the driven member begins to move is different from such movement at other times.

10. A driving apparatus according to claim 9, wherein the elliptical movement is changed such that the driving characteristics include low speed and high torque when the driven member begins to move, while including high speed and low torque otherwise.

11. A driving apparatus according to claim 7, wherein the controller drives only one of the multiple displacement members.

12. A driving apparatus according to claim 7, wherein the multiple displacement members include multi-layer piezoelectric elements, and the first detecting means detects the amplitude and phase of the voltage impressed to each displacement member based on the electric current that is drawn to the multi-layer piezoelectric element.

13. A driving apparatus according to claim 1, further comprising a second phase difference detecting means that detects the phase difference between the voltage impressed to each displacement member and the electric current drawn thereto, wherein the controller changes the drive frequency of each displacement member based on the phase difference detected by the second phase difference detecting means.

14. A driving apparatus according to claim 13, further comprising a memory means that stores the target amplitudes and target phase differences that correspond to the target elliptical locus of the synthesizing member, wherein after adjusting the driving frequencies to become the resonance frequencies based on the phase difference detected by the second phase difference detecting means, the controller changes either the amplitudes or phase of the impressed voltage such that the difference between the amplitudes and phase difference detected by the first detector and the target amplitudes and phase difference stored in the memory means, respectively, are eliminated.

15. A driving apparatus according to claim 14, wherein the memory means stores multiple target amplitudes and phase differences that correspond to the target elliptical locus of the synthesizing member in such a manner that they are associated with a timing at which the parameters of the elliptical movement should be changed.

16. A driving apparatus according to claim 15, wherein the elliptical movement when the driven member begins to move is different from such movement at other times.

17. A driving apparatus according to claim 16, wherein the elliptical movement is changed such that the driving characteristics include low speed and high torque when the driven member begins to move, while including high speed and low torque otherwise.

* * * * *